US006366119B1

(12) United States Patent
Pedersen et al.

(10) Patent No.: US 6,366,119 B1
(45) Date of Patent: Apr. 2, 2002

(54) PROGRAMMABLE LOGIC DEVICE MACROCELL WITH IMPROVED LOGIC CAPABILITY

(75) Inventors: Bruce B. Pedersen; John C. Costello, both of San Jose, CA (US)

(73) Assignee: Altera Corporation, San Jose, CA (US)

(*) Notice: Subject to any disclaimer, the term of this patent is extended or adjusted under 35 U.S.C. 154(b) by 0 days.

(21) Appl. No.: 09/677,156

(22) Filed: Oct. 2, 2000

Related U.S. Application Data

(63) Continuation of application No. 09/201,416, filed on Nov. 30, 1998, now Pat. No. 6,157,208, which is a continuation of application No. 08/766,512, filed on Dec. 13, 1996, now Pat. No. 5,861,760, which is a continuation-in-part of application No. 08/605,445, filed on Feb. 26, 1996, now Pat. No. 5,598,108, which is a continuation of application No. 08/331,964, filed on Oct. 31, 1994, now Pat. No. 5,557,217, which is a continuation of application No. 08/123,435, filed on Sep. 17, 1993, now Pat. No. 5,384,499, which is a continuation-in-part of application No. 08/043,146, filed on Mar. 31, 1993, now Pat. No. 5,268,598, which is a continuation of application No. 07/957,091, filed on Oct. 6, 1992, now abandoned, which is a continuation of application No. 07/691,640, filed on Apr. 25, 1991, now Pat. No. 5,241,224

(60) Provisional application No. 60/026,915, filed on Sep. 24, 1996.

(51) Int. Cl.[7] ............................................. H03K 19/177
(52) U.S. Cl. .............................. 326/39; 326/38; 326/41
(58) Field of Search .................................... 326/37–41

(56) References Cited

U.S. PATENT DOCUMENTS

| 4,742,252 A | 5/1988 | Agrawal ...................... 307/465 |
| 4,758,746 A | 7/1988 | Birkner et al. ............... 307/465 |
| 4,789,951 A | 12/1988 | Birkner et al. ............... 364/716 |
| 4,864,161 A | 9/1989 | Norman et al. ........... 307/272.2 |
| 4,871,930 A | 10/1989 | Wong et al. ................. 307/465 |
| 4,879,481 A | 11/1989 | Pathak et al. ................ 307/465 |
| 4,903,223 A | 2/1990 | Norman et al. .............. 364/716 |
| 4,912,345 A | * 3/1990 | Steele et al. .................... 326/38 |
| 4,918,641 A | 4/1990 | Jigour et al. ................. 364/716 |
| 4,942,319 A | 7/1990 | Pickett et al. ................ 307/465 |
| 4,983,959 A | 1/1991 | Breuninger ............ 340/825.83 |
| 5,003,202 A | 3/1991 | Keida .......................... 307/465 |
| 5,027,315 A | 6/1991 | Agrawal et al. ............. 364/900 |
| 5,053,646 A | 10/1991 | Higuchi et al. .............. 307/465 |

(List continued on next page.)

OTHER PUBLICATIONS

Altera Max EPLD Family Architecture data sheet, Altera Corporation, Jan. 1990, pp. 1–5.
Advanced Micro Devices MACH 1 and MACH 2 Families data sheet, Advanced Micro Devices, Inc., Apr. 1991, pp. 1–7, 14, 15, 28, 29.
*MACH 3 and 4 Family Data Book*, 1993, Advanced Micro Devices, Inc., Sunnyvale, CA.
Plus Logic FPGA2020 data sheet, Plus Logic, Inc., date unknown, pp. 1–7.

*Primary Examiner*—Michael Tokar
*Assistant Examiner*—Don Phu Le
(74) *Attorney, Agent, or Firm*—Fish & Neave; Robert R. Jackson

(57) ABSTRACT

A macrocell for a programmable logic device includes circuitry for allowing a neighboring macrocell to borrow various numbers of the product terms of the macrocell. The macrocell can continue to make full use of its product terms that are not thus borrowed. This includes logically combining and registering the unborrowed product terms. The macrocell may include circuitry for feeding back to the AND array of the programmable logic device a combinatorial or registered signal of the macrocell, and also outputting such a combinatorial or registered signal from the macrocell. When a combinatorial signal is fed back, the register of the macrocell can be used for another signal of the macrocell.

8 Claims, 2 Drawing Sheets

U.S. PATENT DOCUMENTS

| | | | |
|---|---|---|---|
| 5,079,451 A | 1/1992 | Gudger et al. | 307/465.1 |
| 5,168,177 A | 12/1992 | Shankar et al. | 307/465 |
| 5,191,243 A | 3/1993 | Shen et al. | 307/465 |
| 5,231,312 A | 7/1993 | Gongwer et al. | 307/465 |
| 5,260,610 A | 11/1993 | Pedersen et al. | 307/465 |
| 5,350,954 A | * 9/1994 | Patel | 326/38 |
| 5,414,376 A | 5/1995 | Hawes | 326/40 |
| 5,598,108 A | 1/1997 | Pedersen | 326/41 |
| 5,821,774 A | * 10/1998 | Veytsman et al. | 326/39 |

* cited by examiner

PROGRAMMABLE LOGIC DEVICE MACROCELL WITH IMPROVED LOGIC CAPABILITY

CROSS REFERENCE TO RELATED APPLICATIONS

This application claims the benefit of provisional application No. 60/026,915, filed Sep. 24, 1996. This application is also a continuation of application Ser. No. 09/201,416, filed Nov. 30, 1998, now U.S. Pat. No. 6,157,208, which was a continuation of application Ser. No. 08/766,512, filed Dec. 13, 1996, now U.S. Pat. No. 5,861,760, which was a continuation-in-part of application Ser. No. 08/605,445, filed Feb. 26, 1996, now U.S. Pat. No. 5,598,108, which was a continuation of application Ser. No. 08/331,964, filed Oct. 31, 1994, now U.S. Pat. No. 5,557,217, which was a continuation of application Ser. No. 08/123,435, filed Sep. 17, 1993, now U.S. Pat. No. 5,384,499, which was a continuation-in-part of application Ser. No. 08/043,146, filed Mar. 31, 1993, now U.S. Pat. No. 5,268,598, which was a continuation of application Ser. No. 07/957,091, filed Oct. 6, 1992, now abandoned, which was a continuation of application Ser. No. 07/691,640, filed Apr. 25, 1991, now U.S. Pat. No. 5,241,224.

BACKGROUND OF THE INVENTION

This invention relates to programmable logic integrated circuit devices, and more particularly to improved logic macrocells for such devices.

Pedersen U.S. Pat. No. 5,598,108 (hereby incorporated by reference herein) shows a macrocell for programmable logic devices which can form the sum of five product terms and output that sum, either directly or through a register. If a wider fan-in function is needed, the sum formed by one macrocell can be "borrowed" by a neighboring macrocell for combination (i.e., summation) with the five-product-term sum formed by the neighboring macrocell. When the product terms of a macrocell are thus borrowed by a neighboring macrocell, the other resources (e.g., the register) of the first macrocell become unusable. The potential waste of resources is even greater if less than all of the first macrocell's product term resources need to be borrowed.

It is known to make it possible for a macrocell to output one of its product terms (either registered or unregistered) if that product term is not needed for borrowing, even though other product terms of the macrocell are being borrowed. (See, for example, *MACH 3 and 4 Family Data Book,* 1993, Advanced Micro Devices, Inc., Sunnyvale, Calif.) However, no complex sum of products function can be implemented by a macrocell from which any of the product terms need to be borrowed.

In view of the foregoing, it is an object of this invention to increase the flexibility with which product terms of a macrocell can be borrowed by another macrocell or (if not borrowed) put to use in the macrocell of which they are nominally a part.

It is also known to feed back to the AND array of a programmable logic device a signal produced by a macrocell. This enables a macrocell to be used to implement a function that is needed by other macrocells to implement more complex functions. However, the ability to feed back only one signal produced by a macrocell may mean that other resources of the macrocell are wasted.

It is therefore another object of this invention to reduce or eliminate possible waste of macrocell resources due to macrocell architectures in which only one signal produced by a macrocell can be fed back to the AND array of the associated programmable logic device.

SUMMARY OF THE INVENTION

These and other objects of the invention are accomplished in accordance with the principles of the invention by providing macrocells in which different numbers of the product terms can be borrowed by a neighboring macrocell, and the product terms that are not thus borrowed can continue to be put to full use in the macrocell that nominally includes them. For example if a macrocell nominally includes five product terms, the number of borrowed product terms may be zero, two, three, or five. If zero product terms are borrowed, then the macrocell may sum all five of its product terms and output that sum, either directly or through the register of that macrocell. If two product terms are borrowed, then the remaining three may be summed and output (directly or through the register) by the macrocell. If three product terms are borrowed, the remaining two may be summed and output (directly or through the register) by the macrocell. In this way each macrocell can continue to implement sum of products functions even when some of its product terms are being borrowed.

In accordance with another aspect of the invention, either the combinatorial (i.e., sum of products) signal or the registered signal produced by a macrocell can be fed back to the AND array of the associated programmable logic device. A registered or unregistered signal produced by the macrocell can be the output signal of the macrocell. This provides feedback flexibility concurrent with usability (to provide another macrocell output) of macrocell resources that may not be involved in producing the feedback signal.

Further features of the invention, its nature and various advantages will be more apparent from the accompanying drawings and the following detailed description of the preferred embodiments.

DETAILED DESCRIPTION OF THE PREFERRED EMBODIMENTS

Figure 1:
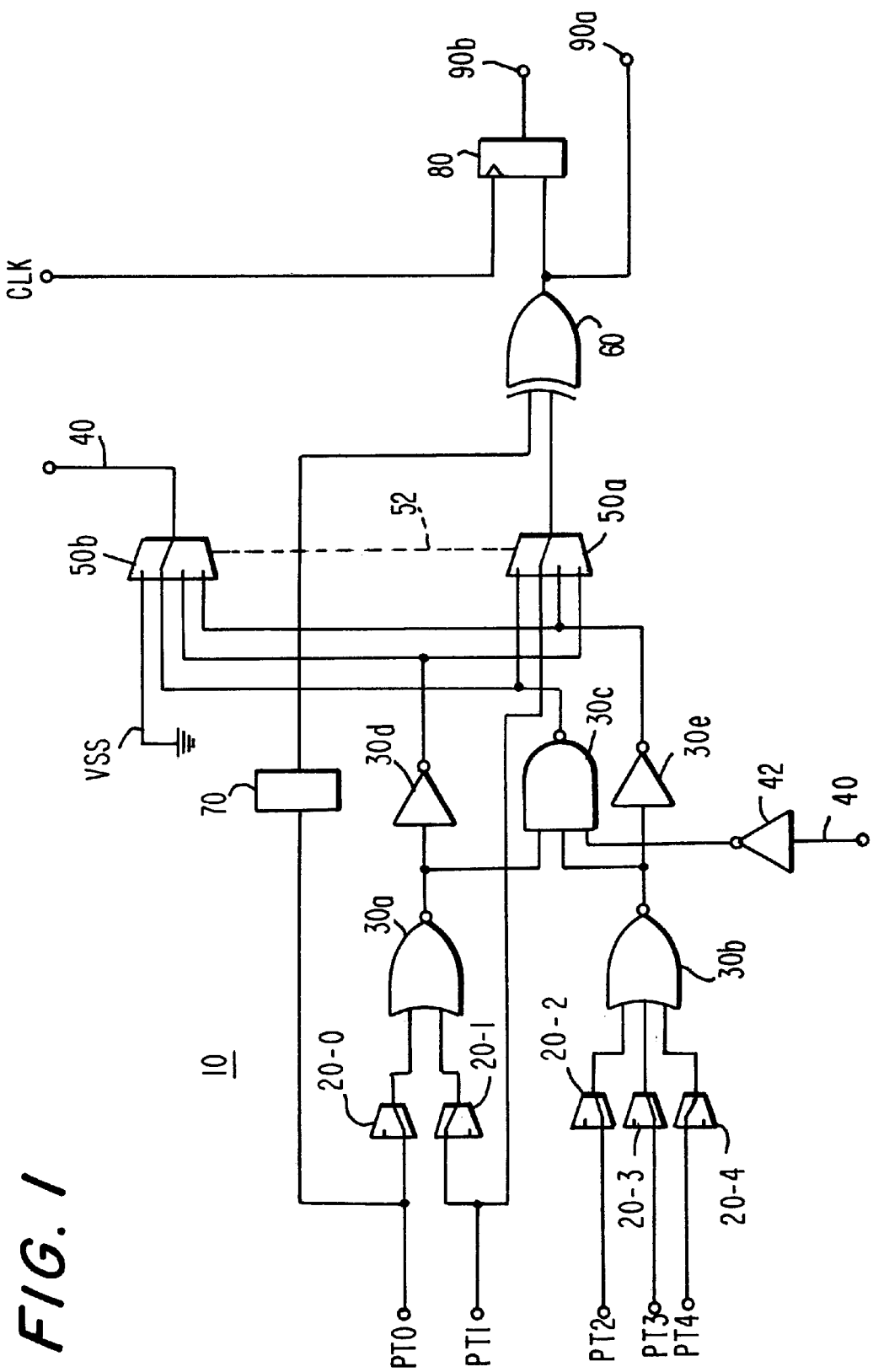
FIG. 1 is a simplified schematic block diagram of an illustrative embodiment of a representative programmable logic device macrocell constructed in accordance with the invention.

The illustrative macrocell 10 shown in FIG. 1 has five product terms PT0, PT1, PT2, PT3, and PT4 as primary inputs. These product terms are generated in a programmable AND array which is not shown in FIG. 1 but which can be entirely conventional. (A representative portion of a programmable AND array is shown at 120 in FIG. 2.) A programmable logic connector ("PLC") 20-0 through 20-4 is respectively associated with each of product terms PT0–PT4 for selectively passing or tying off the associated product term upstream from NOR gates 30*a* and 30*b*.

NOR gate 30*a* logically combines the outputs of PLCs 20-0 and 20-1 and applies the resulting signal to NAND gate 30*c* and inverter 30*d*. NOR gate 30*b* logically combines the outputs of PLCs 20-2, 20-3, and 20-4 and applies the resulting signal to NAND gate 30*c* and inverter 30*e*. The third input to NAND gate 30c is an inverted "allocate in" signal 40 from another macrocell, which may be similar and adjacent to (or otherwise a neighbor of) macrocell 10. The manner in which the other macrocell produces signal 40 will be apparent from the following explanation of how macrocell 10 produces its "allocate out" signal 40, because the "allocate in" signal of each macrocell is the "allocate out" signal of another macrocell. Inverter 42 performs the above-mentioned inversion of "allocate in" signal 40.

NAND gate 30c logically combines the signals applied to it and applies the resulting signal to one input terminal of each of PLCs 50a and 50b. The output signal of inverter 30d is applied to another input terminal of each of PLCs 50a and 50b. The output signal of inverter 30e is applied to still another input terminal of each of PLCs 50a and 50b. The fourth input to PLC 50a is one of the product terms of the macrocell (i.e., PT1). The fourth input to PLC 50b is VSS (logic 0).

Each of PLCs 50a and 50b is programmable to select one of its inputs for transmission to its output terminal. In the most preferred embodiments PLCs 50a and 50b have shared or common configuration bits (also sometimes referred to as function control elements ("FCEs")) so that there is a predetermined relationship between the input selections of PLCs 50a and 50b. This sharing of FCEs (indicated by dotted line 52) helps to reduce the number of FCEs that are required on the device. In alternative embodiments it may be preferred to have PLCs 50a and 50b wholly or at least partly independently programmable, thereby making the signal selections of PLCs 50a and 50b wholly or partly independent of one another.

The output signal of PLC 50a is applied to one input terminal of EXCLUSIVE OR ("XOR") gate 60. The other input to XOR gate 60 is the output signal of invert logic 70. Invert logic 70 is programmable to control possible inversion of the output signal of PLC 50a by XOR gate 60. To perform this function, invert logic 70 may make use of one of the product terms of the macrocell (i.e., PT0). In other words, inversion of the output signal of PLC 50a by XOR gate 60 may be based in whole or in part on the logic level of PT0.

The output signal of XOR gate 60 is applied to the combinatorial output terminal 90a of macrocell 10, and also to the data input terminal of a register 80 (e.g., a flip-flop) which is part of the macrocell. Register 80 also receives a clock signal. Register 80 can store the signal applied to its data input terminal, and it applies the stored signal to the registered output terminal 90b of macrocell 10.

It will be seen from the foregoing that PLC 50a can select any of the following signals for application to XOR gate 60: (1) PT1, (2) the output of inverter 30d (which is a logical combination of PT0 and PT1), (3) the output of inverter 30e (which is a logical combination of PT2, PT3, and PT4), or (4) the output of NAND gate 30c (which is a logical combination of PT0–PT4 and inverted "allocate in" signal 40). Thus macrocell 10 can be used to provide output signals 90 which are dependent on either one of its product terms (PT1), two of its product terms (PT0 and PT1), three of its product terms (PT2–PT4), or all five of its product terms and its allocate in signal 40.

PLC 50b can select any of the following signals for application to the allocate out lead 40 of the macrocell: (1) VSS (logic 0), (2) the output signal of inverter 30d (which is a logical combination of PT0 and PT1), (3) the output signal of inverter 30e (which is a logical combination of PT2–PT4), or (4) the output signal of NAND gate 30c (which is a logical combination of PT0–PT4 and inverted "allocate in" signal 40). Thus the neighboring macrocell that receives as its "allocate in" signal 40 the "allocate out" signal 40 of depicted macrocell 10 can "borrow" two (PT0 and PT1), three (PT2–PT4), or all five (PT0–PT4) of the product terms of macrocell 10. If two of the product terms of macrocell 10 are thus borrowed by a neighboring macrocell, macrocell 10 can still continue to perform logical operations based on combination of the three remaining product terms PT2–PT4. If three product terms are borrowed, macrocell 10 can still continue to perform logical operations based on combination of the two remaining product terms PT0 and PT1. Even if all five product terms are borrowed, macrocell 10 can still be used to output and/or register and output product term PT1. Macrocell 10 is therefore considerably more flexible than prior art macrocells with regard to borrowing and continued use of unborrowed product terms.

Figure 2:
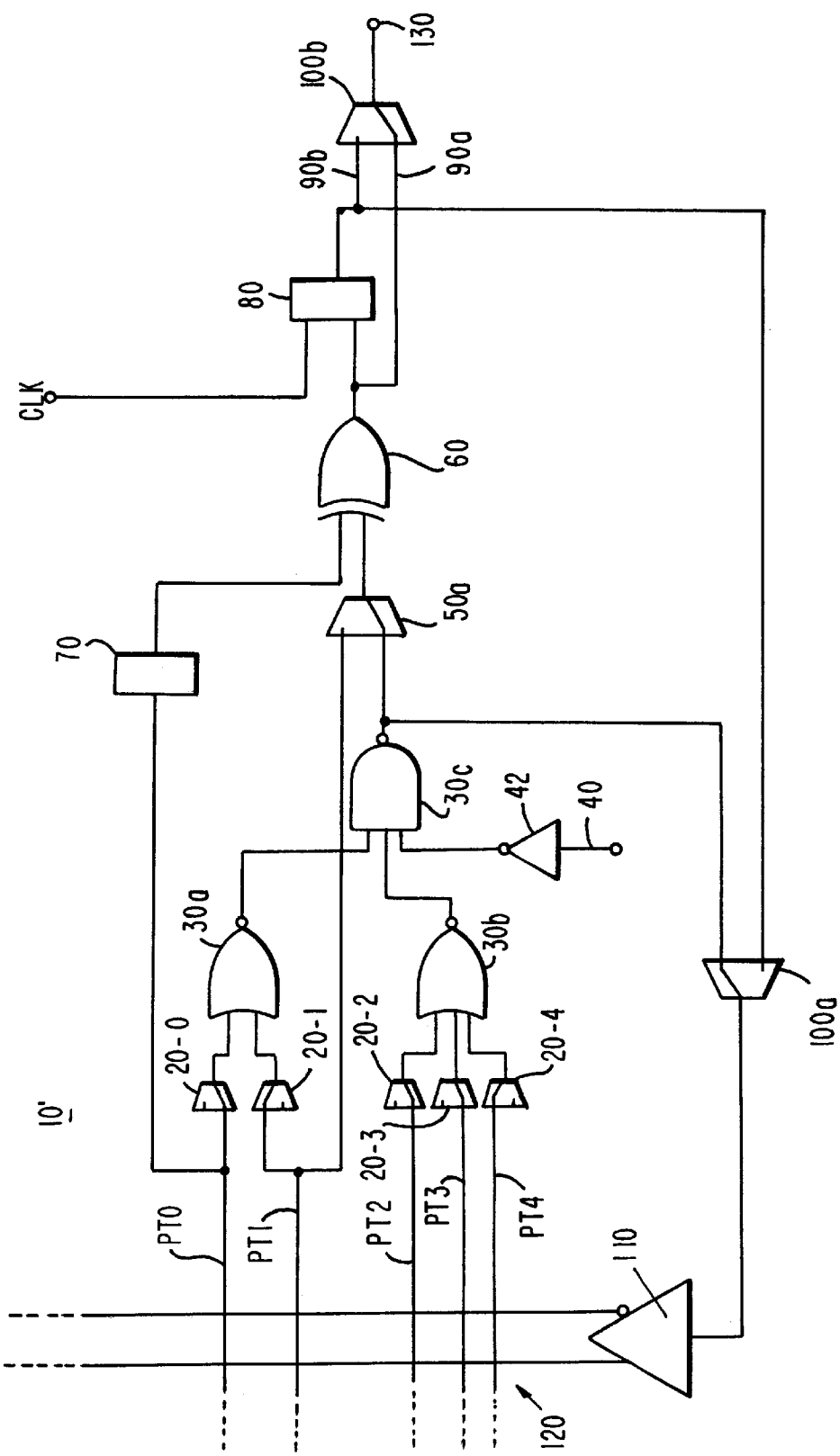
FIG. 2 is a simplified schematic block diagram of another illustrative embodiment of a representative programmable logic device macrocell constructed in accordance with the invention.

FIG. 2 illustrates another aspect of this invention. Elements in FIG. 2 that are the same as or similar to elements in FIG. 1 have the same reference numbers in both FIGS. It will therefore not be necessary to describe those elements again in connection with FIG. 2. Some elements from FIG. 1 are not shown again in FIG. 2. It will be understood, however, that those elements (e.g., 30d, 30e, 50b, and a larger PLC 50a) can be included in the FIG. 2 circuitry if desired.

In the illustrative macrocell 10' shown in FIG. 2 the output signal of NAND gate 30c is additionally applied to one input terminal of PLC 100a. The output signal 90b of register 80 is applied to the other input terminal of PLC 100a and to one input terminal of PLC 100b. The output signal 90a of XOR gate 60 is applied to the other input terminal of PLC 100b.

PLC 100a is programmable to select either of its inputs for transmission to its output terminal. The output signal of PLC 100a is applied to word line driver 110, which drives the true and complement of the applied signal onto respective true and complement word lines in programmable AND array 120. Thus PLC 100a allows either the combinatorial output signal (from NAND gate 30c) or the registered output signal 90b of macrocell 10' to be fed back to the AND array 120 of the programmable logic device. (Note that when PLC 50a is programmed to connect NAND gate 30c to XOR gate 60, the output of NAND gate 30c is either the same as or the inverse of signal 90a. Thus the output of NAND gate 30c is effectively the normal combinatorial output 90a of the macrocell, bearing in mind that driver 110 drives both the true and complement of the applied signal into AND array 120.) Similarly, PLC 100b allows either the combinatorial output signal 90a or the registered output signal 90b to be the final output 130 of the macrocell.

Another advantage of macrocell 10' which should be noted is as follows. A combinatorial signal produced by NAND gate 30c can be fed back to AND array 120 via PLC 100a, and at the same time register 80 can be used to register either that combinatorial signal (if PLC 50a connects elements 30c and 60) or PT1 (if PLC 50a connects PT1 to XOR gate 60). The register resource 80 of macrocell 10' is therefore not necessarily wasted when the macrocell is used for combinatorial signal feedback. Register 80 can still be used to register PT1 if desired.

The foregoing demonstrates that, as compared to the prior art, macrocell 10' has greater feedback and output flexibility, as well as greater potential use of both the combinatorial and register resources of the macrocell.

Various technologies can be used to implement programmable logic devices employing the macrocells of this invention, as well as the various components of those macrocells (e.g., AND array 120, the PLCs, and the FCEs which control the AND array and the PLCs). For example, each PLC can be a relatively simple programmable connector such as a switch or a plurality of switches for connecting any one of several inputs to an output. Alternatively, each PLC can be a somewhat more complex element which is capable of performing logic (e.g., by logically combining several of its inputs) as well as making a connection. In the latter case, for example, each PLC can be product term logic, implementing functions such as AND, NAND, OR, or NOR. Examples of components suitable for implementing PLCs are EPROMs, EEPROMs, pass transistors, transmission gates, antifuses, laser fuses, metal optional links, etc. As has been mentioned, the components of PLCs can be controlled by various, programmable, function control elements ("FCEs"). (With certain PLC implementations (e.g., fuses and metal optional links) separate FCE devices are not required.) FCEs can also be implemented in any of several different ways. For example, FCEs can be SRAMs, DRAMs, first-in first-out ("FIFO") memories, EPROMs, EEPROMs, function control registers (e.g., as in Wahlstrom U.S. Pat. No. 3,473,160), ferro-electric memories, fuses, antifuses, or the like. From the various examples mentioned above it will be seen that this invention is applicable to both one-time-only programmable and reprogrammable devices.

It will be understood that the foregoing is only illustrative of the principles of the invention, and that various modifications can be made by those skilled in the art without departing from the scope and spirit of the invention. For example, the number of product terms nominally associated with each macrocell can be more or less than the five product terms shown in FIGS. 1 and 2. Also, the way in which those product terms are subdivided into groups that can be allocated to (borrowed by) a neighboring macrocell can differ from the exemplary subdivisions shown in FIG. 1. (The FIG. 1 subdivisions referred to are (1) PT0 and PT1, (2) PT2–PT4, or (3) PT0–PT4 and "allocate in" 40.) Additional product terms may be associated with each macrocell for other functions such as to provide an asynchronous clock for register 80 (as an alternative to the depicted clock signal, which is assumed to be synchronous).

What is claimed is:

1. Programmable logic device circuitry comprising a plurality of product term macrocells, each of which includes first circuitry configured to pre-combine multiple different pluralities of product term signals to produce a first signal, and second circuitry configured to combine plural multiplicities of the product term signals and also optionally the first signal from another of the macrocells.

2. The programmable logic device circuitry defined in claim 1 wherein the first circuitry is further configured to also optionally combine the first signal from another of the macrocells with the multiple different pluralities of product term signals to produce the first signal.

3. The programmable logic device circuitry defined in claim 1 wherein the multiple different pluralities include two, three, and five product term signals.

4. The programmable logic device circuitry defined in claim 1 wherein the plural multiplicities include two, three, and five product term signals.

5. Programmable logic device circuitry comprising:
   a plurality of macrocell circuits, each comprising:
      a plurality of product term circuits, each configured to produce a respective product term signal;
      product term utilization circuitry;
      first combinatorial circuitry configured to combine any of a first plurality of different numbers of the product term signals to produce a first signal which is applied to another of the macrocell circuits; and
      second combinatorial circuitry configured to combine any of a second plurality of different numbers of the product term signals and also optionally the first signal from another of the macrocell circuits to produce a second signal which is applied to the product term utilization circuitry.

6. The programmable logic device circuitry defined in claim 5 wherein the first combinatorial circuitry is further configured to also optionally combine the first signal from another of the macrocell circuits with the first plurality of different numbers of the product term signals to produce the first signal.

7. The programmable logic device circuitry defined in claim 5 wherein the first combinatorial circuitry is configured to combine any of two, three, or five of the product term signals.

8. The programmable logic device circuitry defined in claim 5 wherein the second combinatorial circuitry is configured to logically combine any of two, three, or five of the product term signals.

* * * * *